United States Patent
Shan et al.

[11] Patent Number: 6,140,228
[45] Date of Patent: *Oct. 31, 2000

[54] LOW TEMPERATURE METALLIZATION PROCESS

[75] Inventors: Ende Shan, San Ramon; Gorley Lau, Fremont; Sam Geha, Sunnyvale, all of Calif.

[73] Assignee: Cypress Semiconductor Corporation, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/970,107

[22] Filed: Nov. 13, 1997

[51] Int. Cl.⁷ .................................................. H01L 21/44
[52] U.S. Cl. ........................ 438/653; 438/654; 438/656; 438/688; 204/192.17
[58] Field of Search ..................... 438/654, 584, 438/597, 653, 642, 643, 644, 688, 656, 980; 427/528, 97; 29/592.1, 825, 829; 204/192.17

[56] References Cited

U.S. PATENT DOCUMENTS

| | | | |
|---|---|---|---|
| 4,970,176 | 11/1990 | Tracy et al. | 438/187 |
| 5,108,951 | 4/1992 | Chen et al. | 438/187 |
| 5,158,933 | 10/1992 | Holtz et al. | 305/1 |
| 5,270,255 | 12/1993 | Wong | 438/194 |
| 5,358,616 | 10/1994 | Ward | 204/192.15 |
| 5,371,042 | 12/1994 | Ong | 438/653 |
| 5,374,592 | 12/1994 | MacNaughton et al. | 438/643 |
| 5,443,995 | 8/1995 | Nulman | 438/654 |
| 5,582,679 | 12/1996 | Lianjun et al. | 156/651.1 |
| 5,600,182 | 2/1997 | Schinella et al. | 257/763 |
| 5,665,659 | 9/1997 | Lee et al. | 438/646 |
| 5,693,564 | 12/1997 | Yu | 438/192 |
| 5,731,245 | 3/1998 | Joshi et al. | 438/705 |
| 5,911,113 | 6/1999 | Yao et al. | 438/649 |

*Primary Examiner*—Olik Chaudhuri
*Assistant Examiner*—Kurt Eaton
*Attorney, Agent, or Firm*—Oblon, Spivak, McClelland, Maier & Neustadt, P.C.

[57] ABSTRACT

The invention concerns a method of forming a layer of metal on a substrate and fill the via with high throughput. A layer of metal can be formed on a substrate using sequentially a cold deposition step, a slow hot deposition step and a rapid hot deposition step. The cold deposition step need only be performed for a time sufficient to deposit a seed layer of metal over the entire surface on which the metal layer is to be formed. In the slow hot deposition step, further metal is deposited at a low power allowing for surface diffusion of the deposited metal, which is then followed by a rapid hot deposition of metal under bulk diffusion conditions.

24 Claims, 1 Drawing Sheet

LOW TEMPERATURE METALLIZATION PROCESS

BACKGROUND OF THE INVENTION

1. Field of the Invention

This invention relates to metallization processes for use in making devices such as semiconductor devices, and to devices formed using those metallization processes.

2. Background of the Invention

Formation of metallization layers is a fundamental process in the formation of semiconductor devices. In particular, a metal layer can be formed so as to fill openings in a dielectric layer, forming interconnects or vias or cover steps formed during fabrication of a semiconductor device. The formation of a metal layer over vias having a high aspect ratio (i.e., ratio of the depth of the via to the width or diameter of the via) or steps having a relatively large height can be difficult, exhibiting problems such as cusping and voiding, especially as device dimensions are reduced.

In one method of forming a metal layer on a semiconductor wafer, the metal layer is formed using a two step process. In a first step, a relatively thick portion of the metal layer is deposited while the semiconductor wafer is held at a relatively cold temperature (i.e., preferably less than or equal to 200° C. when the metal is Al). The thickness of this portion must be adequate, in view of relevant process parameters (e.g., the geometry being metallized and the metal being used), to ensure that adequate metal is present to avoid the formation of voids during a metal reflow that occurs during the second step. For example, when the metal is an aluminum alloy, this thick portion preferably has a thickness equal to about 50% to 75% of the total thickness of the metal layer to be formed. Further, this portion is preferably deposited at a rate greater than about 150 Å/sec. In the second step, the remainder of the metal is deposited while the semiconductor wafer is held at a relatively high temperature (e.g., when the metal is an aluminum alloy, about 400° C. to about 500° C.) which allows the deposited metal to reflow through grain growth, recrystallization and bulk diffusion. The rate of deposition of the aluminum in the second step is preferably slower than that of the first step, but is preferably greater than about 50 Å/sec., and more preferably between about 100 Å/sec. and about 200 Å/sec. The deposition rate can be increased during the second step to increase the process throughput. However, this method does not effectively minimize the number of defects formed in the metal layer (such as result from cusping and/or voiding).

In another method of forming a metal layer on a semiconductor wafer, the metal layer is formed using a two step process including a first, cold deposition step of a seed layer followed by a second, hot deposition step. However, in this method, a relatively thin portion of the metal layer (e.g., 25% of the overall thickness) is deposited as a seed layer while the semiconductor wafer is held at the cold temperature, while a relatively large portion of the metal layer (e.g., 75% of the overall thickness) is deposited while the semiconductor wafer is held at the hot temperature. When the metal is an aluminum alloy, the wafer can be held at a temperature of about 200° C. for a period of about 10 seconds during the cold deposition step. During the hot deposition step, a heated gas (typically argon) is flowed against the backside of the wafer to heat the wafer and the deposited metal. The wafer can be heated to a temperature of about 375° C. to about 500° C. The wafer is typically held at that temperature for about 3–5 minutes. However, the heated gas flow is kept relatively low (e.g., less than about 15 sccm and typically in the range between about 10 sccm and about 15 sccm) so that the pressure within the process chamber can be kept low (e.g., less than about 2 mtorr). Since the heated gas flow is kept relatively low, the wafer is not heated as fast as is desirable to minimize the number of defects formed (e.g., by cusping and/or voiding) in the metal layer. Efforts to increase the temperature of the heated gas have caused the steady state temperature of the wafer during the hot deposition step to increase, thus increasing the likelihood of damaging the wafer (in particular, existing metallization). Application of heated gas at multiple locations has caused the distribution of defects to be more evenly spread throughout the metal layer, however, it does not adequately reduce the overall number of defects.

Xu et al. report in SPIE, vol. 2335, pp.70–79 processes for filling contacts, via's and trenches with a PVD or CVD barrier metal file and a PVD Al—Cu plug which is applicable for contacts or via's having sizes down to 0.25 $\mu$m and aspect ratios up to 5.

Xu et al. in Thin Solid Films 253 (1994) 367, 337 reports Al planarization processes by high temperature flow as well as a two step cold-hot sputtering, in which 0.25 $\mu$m contacts of a depth of 1.2 $\mu$m were filled.

Accordingly, there remains a need for a process of forming a metallization layer, which reliably forms a layer of good conductivity, is capable of filling high aspect ratio vias of small dimensions (e.g. $\leq 0.40$ $\mu$m and especially $\leq 0.25$ $\mu$m) and can be processed with a high throughput.

SUMMARY OF THE INVENTION

According to one embodiment of the present invention is a method of reliably forming a metallization layer having good conductivity.

According to another embodiment of the present invention is a method of forming a metallization layer having good conductivity by three steps comprising:

i) depositing a seed layer of metal on a first substrate surface, the seed layer being sufficient to cover the substrate surface;

ii) depositing a second amount of metal on said seed layer at a substrate temperature and power providing a metal diffusion rate and a first metal deposition rate sufficient to inhibit void formation in a contact via having an aspect ratio of at least 1.0; and iii) depositing a third amount of metal on said second amount of metal.

The invention enables a layer of metal to be formed on a substrate with few or no voids formed in the layer. According to the invention, a layer of metal can be formed on a substrate using 1) a cold deposition step to form a seed layer; 2) a slow hot deposition step sufficient to fill an opening; and 3) a rapid hot deposition step to obtain a desired thickness. The cold deposition step need only be performed for a time sufficient to deposit metal over the entire surface on which the metal layer is to be formed. In the slow hot deposition step, further metal may be deposited in the opening while the deposited metal undergoes surface diffusion. Under conditions of a high surface diffusion rate relative to the deposition rate, good filling of openings is obtained. Further, when deposition onto a liner/wetting layer of a second metal (e.g. Ti), under appropriate power and temperature conditions, formation of high resistance metal phases (relative to the metal being deposited. E.g. TiAl$_3$) can be inhibited, thus improving (i.e. lowering) contact resistance of the deposited metal in the filled opening. After surface diffusion has been completed, the metal is deposited while undergoing bulk diffusion. After the opening is filed, the metal may be deposited at a rapid rate to meet thickness requirements.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DESCRIPTION OF THE PREFERRED EMBODIMENTS

Figure 1:
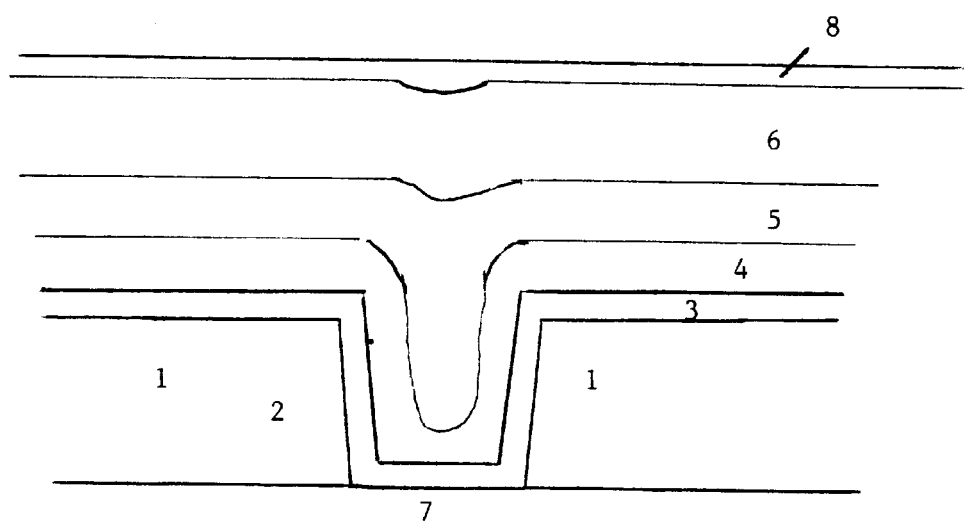
FIG. 1 illustrates a metallization layer formed according to an embodiment of the present invention.

The present method is suitable for depositing a metal layer on a substrate and in particular for depositing a metal layer on a substrate of dielectric material having an opening therein to an underlying conductive region. Generally, an opening through a dielectric layer exposing a diffusion region or an opening through a dielectric layer between (a) a semiconductor substrate or a polysilicon layer and (b) the first metal layer is called a "contact opening", while an opening in other oxide layers such as an opening through an intermetal dielectric layer is referred to as a "via" or "via channel". As used herein, an "opening" will be understood to refer to any type of opening through any type of dielectric layer, regardless of the layer exposed or function of the opening. Furthermore, a "(semi)conductive layer" refers to a layer of either a conventional semiconductive material (that may be conventionally doped) or a conventional conductive material. While the present method is not particulary limited, it is especially advantageous when filling a via or via channel to an underlying metal layer.

An opening, according to the present invention is provided between conductive layers or regions of a semiconductor device, which are separated by an insulating material such as a dielectric material. Non-limiting examples of conductive layers or regions to which an opening may be formed include a source or a drain region of a silicon, germanium or GaAs substrate (which may be lightly, heavily or very heavily doped with conventional N-dopants [such as nitrogen, phosphorous, arsenic, antimony, bismuth, tellurium, sulfur, mixtures thereof etc.] or P-dopants [such as B, Al, Ga, In, mixtures thereof, etc.], the gate of a gate electrode, a second contact (which may be self-aligned), a metallization layer and a local interconnect.

The aspect ratio (height/width or step height/step-step spacing) of the opening according to the present invention is preferably $\geq 1.0$, more preferably $\geq 2.0$. Specific examples of aspect ratios include 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, 5.0, 5.1, 5.2, 5.3, 5.4, 5.5 etc.

The diameter of the hole formed for the opening is not particularly limited. However, the diameter of the opening is preferably from 0.1 to 0.5 $\mu$m, more preferably from 0.2 to 0.5 $\mu$m. Specific examples of the diameter of the hole of the opening are 0.10, 0.15, 0.18, 0.20, 0.22, 0.25, 0.30, 0.35, 0.40, 0.45, 0.50, 0.55 and 0.60 $\mu$m.

Openings may be formed in dielectric layers by conventional methods known to those of ordinary skill in the art such as by photolithography and etching techniques.

A non-limiting example of a method of forming an opening follows:

A resist material may be deposited and/or patterned onto a dielectric and/or passivation layer of a layered structure.

The layered structure may comprise, from top to bottom, the dielectric and an underlying substrate. After deposition and/or patterning of resist material, the exposed regions may be etched to form the opening. Examples of resist materials may be those conventionally known to those of ordinary skill in the art, including those conventionally used in the area of photolithography.

Negative resist materials may contain chemically inert polymer components such as rubber and/or photoreactive agents that react with light to form cross-links, e.g. with the rubber. When placed in an organic developer solvent, the unexposed and unpolymerized resist dissolves, leaving a polymeric pattern in the exposed regions. The preparation and deposition of negative resist materials is within the level of skill of one of ordinary skill in the art and can be performed without undue experimentation. Specific non-limiting examples of negative resist systems include cresol epoxy novolac-based negative resists, as well as negative resists containing one or more photoreactive polymers as described in Kirk-Othmer Encyclopedia of Chemical Technology, 3rd Edition, vol. 17, entitled "Photoreactive Polymers", pages 680–708, the relevant portions of which are hereby incorporated by references.

Positive resists have photoreactive components which are destroyed in the regions exposed to light. Typically the resist is removed in an aqueous alkaline solution, where the exposed region dissolves away. The preparation and deposition of positive resist materials is within the level of skill of one of ordinary skill in the art and can be performed without undue experimentation. Specific non-limiting examples of suitable positive resist systems include Shipley XP9402, JSR KRK-K2G and JSR KRF-L7 positive resists, as well as positive resists containing one or more photoreactive polymers as described in Kirk-Othmer Encyclopedia of Chemical Technology, 3rd Edition, vol. 17, entitled "Photoreactive Polymers", pages 680–708, the relevant portions of which are hereby incorporated by references.

Examples of resist materials are also described by Bayer et al, IBM Tech. Discl. Bull (USA) Vol. 22, No. 5 October 1979 pp 1855; Tabei, U.S. Pat. No. 4,613,404; Taylor et al, J. Vac. Sci, Technol. B. Vol. 13, No. 6, 1995 pp 3078–3081; Argitis et al, J. Vac. Sci, Technol. B. Vol. 13, No. 6, 1995 pp 3030–3034; Itani et al, J. Vac. Sci, Technol. B. Vol. 13, No. 6, 1995 pp 3026–3029; Ohfuji et al, J. Vac. Sci, Technol. B. Vol. 13, No. 6, 1995 pp 3022–3025; Trichkov et al, J. Vac. Sci, Technol. B. Vol. 13, No. 6, 1995 pp 2986–2993; Capodieci et al, J. Vac. Sci, Technol. B. Vol. 13, No. 6, 1995 pp 2963–2967; Zuniga et al, J. Vac. Sci, Technol. B. Vol. 13, No. 6, 1995 pp 2957–2962; Xiao et al, J. Vac. Sci, Technol. B. Vol. 13, No. 6, 1995 pp 2897–2903; Tan et al J. Vac. Sci, Technol. B. Vol. 13, No. 6, 1995 pp 2539–2544; and Mayone et al J. Vac. Sci, Technol. Vol. 12, No. 6, 1995 pp 1382–1382. The relevant portions of the above-identified references which describe the preparation and deposition of resist materials is hereby incorporated by reference. Selection of a resist material for the particular etching conditions is within the level of skill of one of ordinary skill in the art and can be performed without undue experimentation.

Etching of the exposed dielectric material, including stopping at the underlying substrate layer, may be conducted under conditions known to those of ordinary skill in the art, depending on the nature of the dielectric material to be etched and the nature of the underlying substrate. For example, the layered structure may include an etch stop layer (such as a titanium tungsten alloy (TiW), $Si_3N_4$, copper, nickel, cobalt or a noble metal such as ruthenium, rhodium, palladium, osmium, iridium, platinum, gold or silver) positioned directly above the layer not to be etched, such as a metal, a dielectric layer, a substrate material or a selected portion thereof. Etchants such as $SF_6$, $Cl_2$, $C_nH_xF_y$ (where $y \geq 1$, and $x+y=2n+2$, preferably a mixture of $CHF_3/C_2F_6$ [see, for example, U.S. Ser. No. 08/683,407, and/or U.S. Pat. No. 5,468,342, the relevant portions of which are hereby incorporated by reference]), HF, HCl or $CCl_4$ may be used in conventional reactive ion etching. Etching may also be conducted by conventional RF etching. In a preferred embodiment, etching is conducted using a commercially available plasma etcher (e.g. from DRYTEK, Inc. of Wilmington, Mass. and Santa Clara, Calif.) and a $CHF_3/C_2F_6$ etch chemistry according to the manufacturer's instructions.

Examples of dielectric materials include conventional oxides, nitrides, oxynitrides, and other dielectrics, such as borophosphosilicate glass (BPSG), borosilicate glass (BSG), phosphosilicate glass, spin-on glass (SOG), silicon oxide, P-doped silicon oxide (P-glass), silicon nitride ($Si_xN_y$), silicon dioxide, a conventional oxide/nitride/oxide structure, silicon oxynitride (e.g. of the general formula $[Si_aO_xN_y]$ such that $(x/2)+(3y/4)=a$), $Al_2O_3$, metal nitrides such as aluminum nitride [e.g. AlN], $Si_3N_4$, $V_2O_5$, tetraethylorthosilicate-based oxides and titanium oxide, aluminum oxynitrides (e.g. of the general formula $[Al_bO_xN_y]$ such that $(2x/3)+y=b$), aluminosilicates and nitrides thereof (e.g. of the general formula $[Si_aAl_bO_xN_y]$ where $x=2a+3b/2$ and $y=4a/3+b$), boron- and/or phosphorous-doped silicates, aluminates and aluminosilicates.

The thickness of dielectric layer is not particularly limited, but preferably is within the range of about 0.3 to 3.0 μm, more preferably 0.5 to 2.0 μm, even more preferably 0.7 to 1.5 μm. The dielectric layer may comprise a single dielectric material, however, it may also comprise multiple layers of the same or different dielectric materials.

A sputter etch procedure may be performed to remove the corner surface of the dielectric material, providing rounded edges on the channel opening. By rounding the edges of the opening, a greater processing margin is obtained during the filling of the channel. Such a sputter etch process may be conducted by conventional methods known to those of ordinary skill in the art.

After an opening has been etched in the dielectric material, a liner/wetting layer material may be deposited into the opening. The liner/wetting layer may promote adherence of the conductive material to the dielectric material as well as to the material of the conductive layer or region there below (e.g. a metal such as tungsten or Al or doped polysilicon). The liner/wetting layer may also act as a barrier between the metal and the underlying substrate.

Non-limiting examples of suitable liner/wetting layer materials are titanium, zirconium, hafnium, chromium, molybdenum, tungsten, copper, nickel, cobalt or noble metals such as ruthenium, rhodium, palladium, osmium, iridium, platinum, gold and silver, alloys thereof such as titanium-tungsten and titanium nitride. Preferably the liner/wetting layer is titanium, a titanium-tungsten alloy or titanium nitride.

The liner/wetting layer may be deposited by conventional methods known to those of ordinary skill in the art such as chemical or plasma vapor deposition, ionized metal plasma, sputtering, etc.

The thickness of the liner/wetting layer is typically 100 to 600 Å thick, preferably about 500 Å thick.

While the liner layer may be deposited in an amount sufficient to cover the entire exposed surface of the wafer, within the scope of the present invention it is preferably deposited in an amount sufficient to cover the uppermost surface of the dielectric layer, on the side walls of the opening and the bottom of the opening. During the deposition of the liner/wetting layer, it is preferable that the deposition be conducted in a highly directional manner. Directional deposition may be conducted by conventional methods known to those of ordinary skill in the art, for example by collimated sputtering or by Ion Metal Plasma (IMP) methods. A collimation filter having cells with a 1:1 aspect ratio (height:diameter) or greater may be used in most cases.

The conductive material to be deposited and fill the opening is not particularly limited and may be any conductive material, for example Al or Cu or alloys thereof. Non limiting examples include an Al 0.5% Cu alloy, an Al Si 0.5% Cu alloy, Al°, Al—Ge, Al—Si—Ge, Cu and Cu alloy.

Deposition may be conducted using an otherwise conventional physical vapor deposition apparatus, such as a sputtering apparatus which are commercially available, such as an ENDURA sputtering system by Applied Materials of Santa Clara, Calif.

The distance from the sputtering target material to the wafer surface is generally between 1 and 2".

The present method is practiced by a three step deposition method. For the purposes of illustration, the present method is described in the formation of a via formed in an opening. However, the present invention may also be used to deposit metal onto a substrate which does not have a via channel.

In a first step, a seed layer of metal is deposited by a cold deposition process. During this step, a metal material is deposited at a power of 1,000 to 16,000 W, preferably 2,000 to 12,000 W, more preferably 8,000 to 10,000 W. In one embodiment, the power during cold deposition is about 9,000 W.

The substrate temperature during the first cold deposition is not particularly limited. However, this temperature is generally greater than ambient temperature and is typically 40 to 300° C., preferably 150 to 275° C., and even more preferably 180 to 220° C. In one embodiment, the temperature during cold deposition is about 200° C.

The pressure in the deposition chamber for the first cold step is not particulary limited and generally ranges from 0.1 to 10 mtorr, preferably 0.5 to 6 mtorr, more preferably 1 to 3 mtorr. In one embodiment, the pressure during cold deposition is about 2 mtorr.

The rate of deposition is typically about 100 to 300 Å/sec, preferably about 200 Å/sec.

The thickness of the first cold deposition layer is typically from 500 to 4,000 Å, preferably about 2,000 Å thick.

The amount of time necessary to deposit the seed layer is generally sufficient to ensure that all parts of the surface and side walls are covered with the seed layer. Typically the seed layer is deposited over a time period of from 2 to 20 seconds, preferably 5 to 15 seconds, more preferably 8 to 12 seconds, even more preferably about 10 seconds.

For example, when the substrate is a semiconductor wafer, typically the seed layer is deposited shortly after the wafer has been processed in some other manner, such as deposition of a liner/wetting layer of titanium or titanium-tungsten alloy, that causes the temperature of the wafer to be elevated.

Further, the amount of metal forming the seed layer to be deposited in the cold deposition step is typically at least an amount sufficient to ensure coverage of the surface with the metal, so that good wetting is provided in the subsequent slow hot deposition step. Thus, in one embodiment of the invention, the step is performed for an amount of time sufficiently long to ensure that the seed layer covers the substrate surface. The exact amount of time can vary according to a variety of process parameters, such as the metal being deposited, the type of sputtering gas and the geometry (e.g., via aspect ratio, step height) on which the metal is being deposited. Illustratively, an amount of metal less than or equal to about 25% of the overall thickness of the metal layer to be formed can be deposited during the cold deposition step. Illustratively, when aluminum is being deposited using argon as a sputtering gas, the cold deposition step can be performed for less than or equal to about 10 seconds at a rate of 100 to 300 Å/sec.

In a second step, a slow hot deposition is performed under conditions which allow for surface diffusion of the metal. Such conditions include a low power and a high temperature relative to the cold deposition step. Typically, the conditions provide a metal deposition rate and a metal diffusion rate sufficient to inhibit void formation in a contact/via having an aspect ratio of 2.0 or greater (as defined above). In a further embodiment, in which the substrate has a second metal (e.g. a barrier or liner layer) on the surface of channel/via, the conditions of slow hot deposition may be sufficient to inhibit formation of metal phases having a resistivity higher than the first metal(e.g. the metal being deposited).

In the slow hot deposition step, a DC power of from about 100 to about 800 W, preferably from about 200 W to about 400 W may be used.

A substrate temperature of from 300 to 420° C., preferably about 320 to 400° C., more preferably about 370° C. may be used. In order to obtain a substrate temperature within the range of 300 to 390° C., one typically heats the apparatus to a chamber temperature of from 350 to 470° C., preferably about 370 to 450° C., to accommodate the typical difference between chamber temperature and wafer temperature.

The pressure in the deposition chamber for the second step is not particulary limited. However, to maximize the rate at which the substrate temperature increases, the chamber pressure is generally >4 mtorr and may range from 4 to 10 mtorr, preferably from about 4 to 8 mtorr. In one example the pressure is 6 mtorr.

The rate of deposition in the slow hot step is typically about 5 to 50 Å/sec, preferably about 10 Å/sec.

In the slow hot step, surface diffusion time is prolonged so that a larger portion fo the process undergoes surface diffusion. Deposition is typically continued until a bulk diffusion process sets in. The thickness of the second deposition layer is typically from 400 to 8,000 Å, preferably 800 to 6,000 Å, more preferably 1,500 to 5,000 Å, even more preferably about 2,000 Å. In one embodiment, the thickness of the second deposition layer is about 1,000 Å thick. By slowly depositing the metal under hot deposition conditions, the metal is deposited under conditions in which surface diffusion is effective to fill openings having a diameter of $\leq 0.5$ $\mu$m, preferably $\leq 0.35$ $\mu$m, more preferably $\leq 0.25$ $\mu$m and an aspect ratio of $\geq 2.0$, preferably $\geq 2.5$, more preferably $\geq 3.0$, with the substantial absence of voids (e.g. a void rate of $\leq 1$% per 100 opening).

During the second deposition step, heating may be conducted by conventional methods known to those of ordinary skill in the art, such as by radiant heat or conductive heating. For example heating may be conducted by backside gas flow of a hot gas such as Ar, past a heating coil. In one embodiment of the invention, the flow rate of the heating gas is greater than or equal to about 15 sccm. In a further embodiment, the flow rate of the heating gas is greater than or equal to about 20 sccm. In a still further embodiment, the flow rate of the heating gas is greater than or equal to about 30 sccm. In yet a further embodiment, the flow rate of the heating gas is greater than or equal to about 40 sccm.

Any appropriate gas can be used as the heating gas (e.g., any gas that doesn't react with the metal being deposited or other materials formed on or in the substrate), though the heating gas should be the same as other gas(es) used in the process chamber, e.g., the sputtering gas injected into the process chamber through gas jets. For example, any inert gas, such as helium, neon, argon and a mixture thereof can be used. Argon, in particular, is a typical gas used to sputter metal, and is well-suited for use with the invention.

The second step of a slow hot deposition allows for surface diffusion of the metal being deposited and effective filling of an opening. Surface diffusion is typically faster than bulk diffusion or grain boundary diffusion and therefore allows for good flux of the metal into the opening. In addition, slow hot deposition allows lowering of the wafer temperature and hence, reduced formation of $TiAl_3$. The formation of excessive amounts of $TiAl_3$ is undesirable as this contributes to increased resistance of the metallization layer. Resistivity of $TiAl_3$ is 10 times higher than Al. The resistivity of a metallization layer will be proportional to the amount of $TiAl_3$ formed at an interface between a Ti liner/wetting layer and a conductive material of Al. However, the amount of $TiAl_3$ will be proportional to the temperature of deposition of the conductive material. For example, at a wafer temperature of 430° C., a $TiAl_3$ layer of about 1,500 Å thick of was formed, the Al conductive material layer being 6,800 Å thick. At a wafer temperature of 370° C., a $TiAl_3$ of about 300 Å thick formed, the Al conductive material layer being 7,800 Å thick. Therefore, a lower wafer temperature allows for decreased formation of $TiAl_3$, and therefore a metallization layer of high conductivity and low resistance.

During the third rapid hot deposition step, the power and therefore the rate of deposition is increased to provide for rapid deposition of the metal sufficient to achieve the total thickness of metal desired. The metal layer is deposited under conditions such that bulk diffusion occurs. Generally the power during the third deposition step is about 2,000 to 16,000 W, preferably 4,000 to 12,000 W, more preferably 8,000 to 10,000 W and the pressure is typically the same or less than that of the slow hot step (e.g. from 1 to 8 mtorr, preferably 2 to 6 mtorr, more preferably 4 to 6 mtorr). Typically the substrate temperature is from 350 to 390° C. The third rapid hot deposition step is not important for filling of the opening, but rather is a way to increase throughput.

The result of a metallization process according to the present invention is illustrated in FIG. 1, where wherein 1 is a dielectric material, 2 is an opening in a dielectric material, 3 is a wetting layer such as Ti formed in an opening; 4 is a seed layer formed in said opening on the surface of the wetting layer, by a cold deposition technique; 5 is a conductive material layer formed on the surface of the seed layer, by a slow hot deposition technique; 6 is a conductive material layer formed on the surface of the conductive material layer 5 by a rapid hot deposition technique; 7 is a conductive region of a semiconductor device and 8 is an anti-reflective layer.

After deposition of the conductive material, further processing may include a metal etch back or planarization step, preferably planarizing using conventional Chemical Mechanical Polishing (CMP). When a damascene structure is used, further processing may include deposition of an anti-reflective (ARC) layer providing for better patterning by photolithographic techniques.

The present method may be used to deposit any metal film on a substrate. However, the present invention is particularly useful for filling openings, and especially useful for filling openings having an aspect ratio of $\geq 3:1$.

Each of the three deposition steps are conducted under otherwise conventional operating conditions. For example, a substrate (e.g., a semiconductor wafer comprising Si) may be positioned within a process chamber. The process chamber is held at a vacuum pressure and a sputtering gas is injected into the process chamber through one or more gas jets. The gas is ionized and the ions are accelerated toward a sputtering target. Metal atoms in the target are dislodged from the sputtering target, and deposited on the upper surface of the substrate, thus forming a metal layer on the substrate.

All of deposition steps can advantageously be performed in the same process chamber. However, the method can also be implemented so that more than one process chamber is used to implement the individual steps of the method.

The three deposition steps of the methods described above are typically preceded and followed by a number of other steps. These other steps are typically performed in processing chambers other than that used to implement a method of the invention.

The invention can be used, for example, to form various types of metallization on a semiconductor substrate (e.g., a semiconductor wafer). For example, a metal layer formed on the dielectric layer may be electrically connected to a polysilicon gate formed on oxide by a metal contact that extends through a dielectric layer. Similarly, metal layer may be electrically connected to an electrically doped region of the silicon substrate by a metal contact that extends through a dielectric layer. A second metal layer formed on the dielectric layer that overlies the first metal layer may be electrically connected to the first metal layer by a metal contact that extends through the dielectric layer. When aluminum is used for the first metal layer then a barrier layer preventing or inhibiting migration of silicon atoms into the aluminum may be necessary. Examples of such a barrier layer include titanium-tungsten alloy or titanium nitride. The barrier layer may have a layer (such as titanium) between it and the underlying structure that reduces contact resistance.

The invention is broadly applicable to the formation of a metal layer on any type of substrate or device. For example, formation of a metal layer according to the invention can be accomplished on any type of semiconductor substrate, such as a semiconductor wafer. Illustratively, the invention can be used to form metal layers in active electronic components (e.g., integrated circuit chips, transistors and diodes) and passive electronic components (e.g., resistors, capacitors and inductors). The invention can also be used to form metal layers in other types of devices, such as lead frames, medical devices, flat panel displays and microelectronic masks.

Having generally described this invention, a further understanding can be obtained by reference to certain specific examples which are provided herein for purposes of illustration only and are not intended to be limiting unless otherwise specified.

EXAMPLE 1

Wafers are loaded into a sputter deposition apparatus and degassed to remove moisture. A sputter etch procedure is conducted to provide a rounded edge in a dielectric layer. Next, a wetting layer of Ti, 500 Å thick, is deposited on the inside of opening by a collimated sputtering technique. A seed layer of Al may be deposited on the wetting layer in the opening, 2,000 Å thick by a cold deposition, at a power of 9,000 W at 250° C., for 10 seconds. After the seed layer has been formed, the opening via may be filled with Al by a slow hot deposition technique forming a layer of 3,000 Å thick by deposition at a power of 200 W, and a wafer temperature of 370° C., for 180 seconds. After the opening has been filled, a further thickness of Al is deposited, 3,000 Å thick at a power of 9,000 W, a wafer temperature of about 370° for 15 seconds. To facilitate further processing by photolithography, an anti-reflective coating of TiW (10:90 by wt.; 1:1 atomic ratio) 300 Å may be deposited, followed by a cooling of the wafer for 30 seconds, using a standard cooling procedure.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of forming a layer of metal on a substrate, comprising:
   i) deposing a seed layer of the metal on a first substrate surface, said seed layer being sufficient to cover said first substrate surface;
   ii) depositing a second amount of the metal on said seed layer at a substrate temperature of 300 to 420° C. and power of 100 to 800 W under conditions sufficient to provide a metal diffusion rate and a metal deposition rate sufficient to inhibit void formation in an opening having an aspect ratio of at least 2.0; and
   iii) depositing a third amount of metal on said second amount of the metal.

2. The method of claim 1, wherein said substrate further comprises an opening.

3. The method of claim 2, further comprising, before step i) forming a barrier/liner layer in said opening.

4. The method of claim 3, wherein step ii) is conducted at a substrate temperature and power sufficient to inhibit formation of filamentous metal phases with said barrier/liner layer, having a resistivity greater than that of said metal.

5. The method of claim 1, wherein said second amount of metal is deposited at a rate of about 5 to 30 Å/sec.

6. The method of claim 1, wherein said second amount of metal is deposited at a pressure of 4 to 6 mtorr.

7. The method as in claim 1, wherein said second amount of metal is deposited to form a layer of 400 to 3,000 Å thick.

8. The method as in claim 1, wherein said metal is aluminum.

9. The method as in claim 1, said seed layer is deposited at a power of 9,000 W.

10. The method of claim 1, wherein said seed layer is deposited at a pressure of 1 to 3 mtorr.

11. The method of claim 1, wherein said seed layer is deposited at a rate of 100 to 300 Å/sec.

12. The method of claim 1, wherein said seed layer is deposited to form a layer of 500 to 4,000 Å.

13. The method of claim 1, wherein step ii) further comprises heating said substrate by backside gas flow.

14. The method of claim 13, wherein said gas is Ar.

15. The method of claim 2, wherein said opening has an aspect ratio of at least 3:1 (H/W).

16. The method of claim 2, wherein said second amount of metal deposited is sufficient to fill said opening.

17. The method of claim 2, further comprising forming a liner/wetting layer in said opening before step i).

18. The method of claim 2, wherein said opening has an aspect ratio of at least 2.5 (H/W).

19. A metallization layer formed by a process comprising:
   i) deposing a seed layer of the metal on a first substrate surface, said seed layer being sufficient to cover said first substrate surface;
   ii) depositing a second amount of the metal on said seed layer at a substrate temperature of 300 to 420° C. and power of 100 to 800 W under conditions sufficient to provide a metal diffusion rate and a metal deposition rate sufficient to inhibit void formation in an opening having an aspect ratio of at least 2.0; and
   iii) depositing a third amount of metal on said second amount of the metal.

20. The method of claim 1, wherein said second amount of metal is deposited at a power of at least 100 to less than 400 W.

21. The method of claim 3, wherein said barrier/liner layer comprises a material selected from the group consisting of titanium, a titanium-tungsten alloy or titanium nitride.

22. A method of forming a layer of metal on a substrate, comprising:
   i) depositing a seed layer comprising aluminum on a barrier/liner layer comprising titanium in a first substrate opening having an aspect ratio of at least 2.0, said seed layer being sufficient to cover said first substrate surface within said opening;
   ii) depositing an amount of metal comprising aluminum on said seed layer at a substrate temperature of 300 to 420° C. and power of 100 to 800 W, under conditions sufficient to provide a diffusion rate and a deposition rate sufficient to inhibit void formation in an opening having an aspect ratio of at least 2.0; and
   iii) depositing a second amount of said metal on said first amount of said metal.

23. The method of claim 22, wherein said barrier/liner layer comprises a material selected from the group consisting of titanium, a titanium-tungsten alloy or titanium nitride.

24. The method of claim 1, wherein said second amount of the metal is deposited under conditions which inhibit the formation of filamentous metal phases having a resistivity greater than that of said metal.

* * * * *